United States Patent

[11] 3,615,538

[72] Inventors John E. Peters;
Donald B. Johnson, both of Racine, Wis.

[21] Appl. No. 749,582
[22] Filed Aug. 2, 1968
[45] Patented Oct. 26, 1971
[73] Assignee Printing Developments, Inc.
New York, N.Y.

[54] PHOTOSENSITIVE PRINTING PLATES
11 Claims, No Drawings

[52] U.S. Cl. .......... 96/75, 96/86 P, 96/115 R, 96/91 N, 96/33, 96/35.1
[51] Int. Cl. .......... G03c 1/68, G03c 1/52, G03c 1/94
[50] Field of Search .......... 96/115, 36.2, 86, 35.1, 75, 91

[56] References Cited

UNITED STATES PATENTS

| | | | |
|---|---|---|---|
| 2,690,966 | 10/1954 | Minsk et al. | 96/35.1 X |
| 2,991,204 | 7/1961 | Astle | 148/6 |
| 3,405,017 | 10/1968 | Gee | 96/36.2 X |
| 3,482,977 | 12/1969 | Baker | 96/36.2 |

FOREIGN PATENTS

| | | | |
|---|---|---|---|
| 677,549 | 1/1964 | Canada | 96/35.1 |

*Primary Examiner*—Ronald H. Smith
*Attorney*—Brumbaugh, Graves, Donohue & Raymond

ABSTRACT: Photosensitive printing plates wherein the photosensitive resist coating is adhered to the metallic base layer by means of a silane compound to improve the physical properties of the photosensitive resist coating so it will withstand mechanical action during hand development and further wherein the photosensitive resist coating also contains a dye or a pigment to increase contrast after development, to improve reproduction characteristics and to increase mechanical resistance.

PHOTOSENSITIVE PRINTING PLATES

The present invention relates to photosensitive printing plates.

Photosensitive printing plates generally have a metallic base layer or substrate and a photoresist coating thereon. When one type of plate is exposed to light, through an image-bearing positive or negative transparency, those areas struck by the light are photoinsolubilized. The application of a developer thereto then removes the resist or coating from the unexposed areas, thus giving a highly resistant stencil representing the image of the transparency. In the case of bimetallic lithographic printing plates wherein the metallic substrate is copper-coated aluminum or copper-coated stainless steel, this stencil then protects the copper underneath during the copper etching step.

The exposed photosensitive plates are generally developed in a vapor degreaser or in a whirler by spraying the developer on the exposed plates. However, when the resist coating contains a cinnamate polymer or an aryl azide as the photosensitive component thereof, the stencil has low mechanical resistance and the adhesion of the resist coating to the metal substrate is poor. Moreover, the contrast between the exposed and unexposed areas is poor and a post development bake or exposure is needed. This development procedure for this coating is tedious and untidy or requires expensive mechanical equipment. In lithographic printing plates the majority of the plates are made by hand development using pads or swabs. However, the above resist or stencil does not have enough mechanical resistance to permit hand development.

Accordingly, it is an object of the present invention to provide photosensitive printing plates wherein the photosensitive resist coating contains a cinnamate polymer or an aryl azide as the photosensitive component thereof and yet wherein the photosensitive resist coating has improved physical properties so it will withstand mechanical action during development.

It is a further object of the invention to provide such photosensitive printing plates having increased contrast after development between the exposed and unexposed portions and improved light sensitivity and reproduction characteristics.

The photosensitive printing plates which are improved by the present invention have a metallic base layer or substrate and a photosensitive resist coating thereon.

The metallic base layer or substrate can be of any conventional metals used in the graphic arts such as aluminum, zinc, magnesium and the like. The preferred metallic substrate is either copper-coated aluminum or copper-coated stainless steel.

The photosensitive resist coating compositions are standard articles of commerce such as the Eastman Kodak Company KMER, KOR, KPR, KPL, KPR-2, KPR-3,and KFTR photoresists; the Philip A. Hunt Chemical Corporation Waycoat photoresist and Autodize Corporation photoresist. These photoresists are characterized by having an organic solvent-soluble photosensitive material therein which is either a cinnamate polymer or an aryl azide.

The organic solvent-soluble cinnamate polymers are conventional photosensitive compounds, the common groups of which are cinnamoyl compounds and cinnamic acid esters of starch, polyvinyl alcohol, cellulose, partially hydroxyalkylated cellulose or polyvinyl alcohol, esterified cellulose or polyvinyl alcohol, and ethylene-vinyl alcohol with cinnamic acid halides which would produce an ethylene vinyl cinnamate copolymer. The cinnamate polymers have light-sensitive groups built into their structures so that by irradiation cross-links are formed between polymer molecules thereby forming larger molecular units to lower greatly their solubility. Typical examples of such cinnamate polymers include cinnamoyl-polystyrene resin (formed by the acylation of polystyrene with cinnamoly chloride) which has the following structural unit:

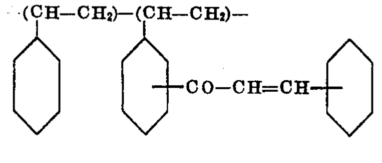

and polyvinyl cinnamates (U.S. Pat. No. 2,725,372) which are formed by treating polyvinyl alcohol with a cinnamic acid halide such as cinnamic acid chloride, o-chloro or m-nitro cinnamic acid chlorides, which have the following general structural unit:

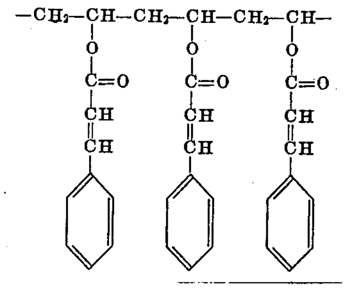

In the case of polyvinyl cinnamate, the mole percent esterification of the polyvinyl alcohol may be varied according to quality requirements. The most useful polyvinyl cinnamate material contains 60 to 100 mole percent of the fully esterified material, the remaining structural units being vinyl alcohol groups.

The organic solvent-soluble aryl azides are also conventional photosensitive materials, the general structural formulas of which as follows:

$$N_3-R-CH=CH-R_1$$

or $$N_3-R-C(=O)-R_1$$

or $$N_3-R-R_1$$

or $$N_3-R-N_3$$

where R represents a monocylic arylene group such as phenylene, methylphenylene or nitrophenylene and $R_1$ represents a monocyclic aryl group, such as phenyl, azidophenyl, benzyl, azidobenzyl, tolyl, or azidotolyl. Typical examples of such arylazides are represented by the following compounds:

4,4'-diazidostilbene

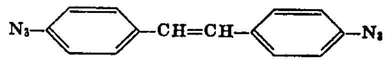

p-phenylene-bis (azide)

p-azidobenzophenone

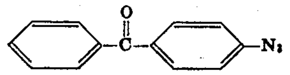

4,4'-diazidobenzophenone

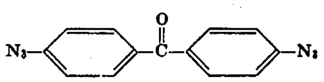

4,4'-diazidodiphenylmethane

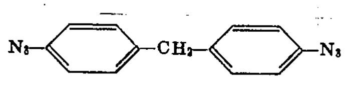

The photosensitive resist coating compositions used in forming the photoresist coating contain, in addition to variable amounts of the organic solventsoluble photosensitive material, an organic solvent therefor, such as xylene, acetone, methyl, glycol acetate, and the like, and sometimes a binder therefor, such as natural and synthetic rubbers. Additives may also be present in small amounts therein, such as nitro or ketone compounds and quinones, to increase the sensitivity of the photosensitive material to actinic light (U.S. Pat. Nos. 2,610,120 and 2,670,285–7).

The above-described photosensitive printing plates are improved by the present invention by associating a silane compound with the photosensitive resist coating so as to improve the physical properties of the coating in order that it will withstand mechanical action during hand development. The silane compounds can be associated with the resist coating in either one of two ways.

Thus, the silane compound can be directly incorporated into the photosensitive resist coating composition and hence in the coating made therefrom. When associated in this manner, the silane compound is present in the photoresist coating composition in an amount of from about 1.5 by volume (0.6 based on the 100% active material) to about 50% by volume (20% based on 100% active material) and preferably in an amount of about 28% by volume. In the photosensitive resist dry coating present on the photosensitive printing plate wherein the solvent has been evaporated therefrom, the silane compound is generally present therein in an amount from about 2.4% to about 45% by weight thereof and usually about 31% by weight.

The other means for associating the silane compound with the resist coating is to have it present as an intermediate layer between the metallic base layer or substrate and the photosensitive resist coating. When so associated, the photosensitive resist dry coating generally has a thickness in the range from about 50 to 250 microinches and optimally of about 150 microinches while the thickness of the intermediate dry silane layer or film generally is in the range from about 2 microinches to about 250 microinches, a thickness in the range from about 5 microinches to about 50 microinches being preferred.

In order to improve further the photosensitive printing plates of the invention so as to increase the contrast after development between the exposed and unexposed portions, to improve the light sensitivity and reproduction characteristics, and to increase further the mechanical resistance, a pigment or a dye may be incorporated in the photosensitive resist coating. When used, the dye is generally present in the photosensitive resist coating composition applied to the plates in an amount from about 0.05% to about 0.5% by weight and usually is present in an amount of about 0.3% by weight. The amount of dye in the dried photoresist coating generally is from about 0.2% to about 2% by weight thereof and usually about 1.2% by weight. The amount of pigment, when used, which is present in the photosensitive resisting coating composition generally ranges from about 0.75% to about X 5% by weight and usually is present therein in an amount of about 3% by weight. The amount of pigment in the dried photoresist coating generally is from about 3% to about 20% by weight thereof and usually is about 12% by weight. A pigment is not incorporated into the photoresist coating composition when the silane compound is used therein due to incompatibility but rather the pigment is used in the photoresist coating only when the silane compound is used in the intermediate layer between the photoresist coating and the metallic substrate.

The silane compounds which are utilized in the photosensitive printing plates of the invention have the following general structural formula:

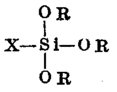

where R is an alkyl radical having from one to nine carbon atoms and X is an aminoalkyl radical having from one to 18 carbon atoms. Representative examples of the R radicals include the straight and branched chain methyl, ethyl, propyl, pentyl, hexyl, heptyl, octyl and nonyl radicals. Representative examples of the X radicals are aminoethyl, aminopropyl, aminohexyl, aminodecyl, aminooctyldecyl, aminoethylaminopropyl, methylpropionylaminoethylaminopropyl, and the like. Typical examples of these silane compounds include the following materials.

gamma-aminopropyl-triethoxy silane $H_2N(CH_2)_3Si(OCH_2CH_3)_3$ N-beta-aminoethyl-gamma-aminopropyl-trimethoxy silane $H_2N(CH_2)_2NH(CH_2)_3Si(OCH_3)_3$ N'-methylpropionyl-N-beta-aminoethyl-gamma-aminopropyl-trimethoxy silane $CH_3O(CO)(CH_2)_2NH(CH_2)_3Si(OCH_3)_3$ The criticality of the nature of the silane compound is indicated by the fact that the following silane compounds were unsuitable, since their use resulted in image loss on developed printing plates prepared therefrom:

gamma-chloropropyl-trimethoxy silane $C1H(CH_2)_3Si(OCH_3)_3$

Glycidoxypropyl-trimethoxy silane

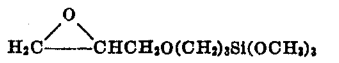

Vinyl-tris(2-methoxyethoxy silane $C_2H_3Si(OC_2H_4OCH_3)_3$

The dyes which may be incorporated into the photosensitive resist coating are the well-known triarylmethane dyes, xanthene dyes and copper phthalocyanine dyes.

The triarylmethane dyes usually have the following general structural formula:

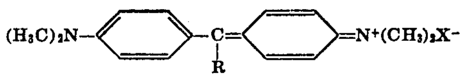

Examples thereof include the following compounds: Crystal violet 6B where R is

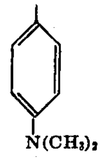

Calcozine Violet 4BPX where R is

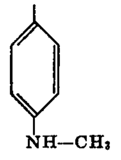

Victoria Blue B where R is

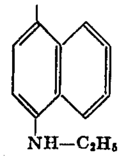

Malachite Green where R is

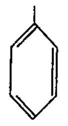

Rhoduline Blue where R is

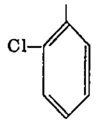

The xanthene dyes are represented by Rhodamine B base which has the following structural formula:

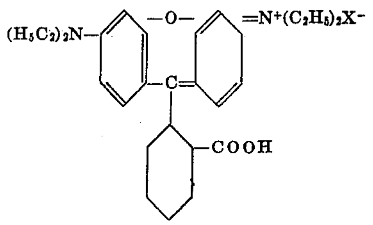

The copper phthalocyanine dyes are represented by Orasol Brilliant Blue G which is C.I. solvent Blue 52.

The criticality of the nature of the dyes is indicated by the fact that the monoazo and diazo dyes were unsuitable, since their use resulted in poor color contrast.

The pigments which may be added to the photosensitive resist coating are the well-known phosphotungstomolybdic lakes of triarylmethane dyes and the copper phthalocyanine pigments, such as Peacoline Blue. Representative examples thereof include Martex Blue which is C.I. Pigment Blue 1.It is the phosphotungstomolybdic lake of the following triarylmethane dye:

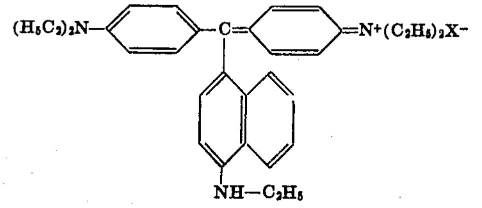

Victoria Blue (C.I. Pigment Blue 10 ) is the phosphotungstomolybdic lake of the following triarylmethane dye:

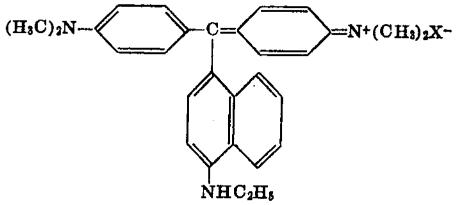

and Pigment Permanent Purple is the phosphotungstomolybdic lake of the following triarylmethane dye:

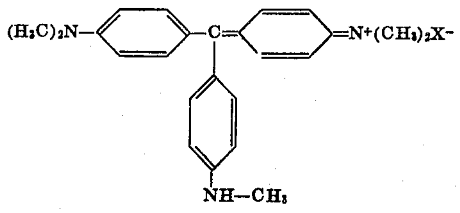

The photosensitive resist coating compositions, as noted above, are commercial products which may be prepared by dissolving the organic solvent-soluble photosensitive material in an organic solvent therefor. When the photosensitive resist coating composition is to contain the silane compound therein, the silane compound is added thereto with mixing from a solution thereof, such as a 40% methanol solution of the silane compound. The photoresist coating compositions which contain a dye may be prepared by blending the dye therewith, whereas the incorporation of a pigment into the silane-free photosensitive resist coating composition requires the use of pebble milling.

The intermediate coating composition containing the silane compound can be prepared by blending the silane compound with a suitable solvent therefor, such as methanol. This solution can then be diluted with water, alcohol or alcohol and water to form the coating composition for the intermediate layer. This coating composition generally has a concentration of 0.4% to 12%, usually from 2.4% to 4.8%, by weight silane compound (based on 100% active material).

The photosensitive printing plates of the invention can be prepared by coating the metallic base or substrate with the silane coating composition, drying the coating and then applying the photosensitive resist coating thereover using a whirler and drying the photoresist top coat. Alternatively, the printing plates can be prepared without an intermediate silane layer by coating the metallic base or substrate with the photoresist coating composition containing the silane compound, using a whirler, and then drying the coating.

The photosensitive plates of the invention are used in the conventional manner. Thus the photosensitive plates are exposed through a photographic positive or negative transparency to a light source and developed with a developer, such as xylol and/or Cellosolve acetate (ethylene glycol monobutylether acetate) and the like, to remove the developer soluble areas of the photoresist, namely, those areas not exposed to light. The developed plates containing the photoinsolubilized or developer-insoluble light exposed areas are then etched with an etchant, such as a nitric acid or ferric nitrate solution in the case of copper-coated aluminum and copper-coated stainless steel metallic substrates, to remove the bare copper metal, the photoinsolubilized coating composition in the light exposed areas serving as a resist composition in the light exposed areas serving as a resist coating. After removal of the resist coating from the photoinsolubilized areas, ink may then be applied thereto and the plates used for printing.

The improved photosensitive printing plates of the invention will be further illustrated by the following examples.

EXAMPLE 1

A copper-coated aluminum substrate was treated by immersion in an aqueous methanol solution containing 6% by weight of 100% active N-beta-aminoethyl-gamma-aminopropyl-trimethoxy silane. The pH of the solution was adjusted to 10.0 by a small addition of chromic acid to improve the shelf life of the solution, to improve its ability to coat on copper, and to increase the shelf life of the treated metallic substrate before it is coated with the light sensitive resist coating. The substrate was then dried to a coat thickness of 50 microinches. The coated substrate was then further coated, using a whirler operating at a speed of 76 r.p.m., with a xylene solution of 4,4'-diazidostilbene. The coated substrate or plate was then baked for 1 hour at 180° F. The thickness of the photosensitive resist coating was approximately 150 microinches.

This photosensitive plate was exposed through a negative separation to an arc light for 150 lux units exposure. It was then developed with a xyleneCellosolve acetate developer using a pad or swab to remove the stencil from the unexposed areas. This development exposed the copper in the unexposed areas. The plate was then etched with a ferric nitrate etch using a pad to remove the copper from the unexposed areas. The stencil or resist protected the copper underneath it. After rinsing, the plate was ready for a printing operation. The photomechanical reproduction of the photosensitive resist coating was very good. Example 2

In this example, the silane compound was added to the photosensitive resist coating and there was no undercoat or intermediate coat used. A clean copper-coated stainless steel substrate was coated, using a whirler operating at 76 r.p.m., with a xylene solution of polyvinyl cinnamate containing about28% by volume of N'-methylpropionyl-N-beta-aminoethyl-gamma-aminopropyl-trimethoxy silane.

The plate is dried to provide a photoresist coating containing approximately 31% by weight of the silane compound and then baked for 1 hour at 180°F. It was then processed as in example 1,but exposure was 100 lux units. The photomechanical reproduction of the photosensitive resist coating was good.

EXAMPLE 3

The copper-coated aluminum substrate was processed as in example 1 except the photosensitive resist coating composition further contained about 3% by weight of Martex Blue pigment. The stencil evaluation indicated good reproduction of highlight areas and clarity of shadow areas.

EXAMPLES 4–8

These five comparative examples further illustrate the remarkable improvement achieved by the photosensitive printing plates of the invention.

The plate of example 4 was a comparative plate wherein the plate had thereon a photosensitive resist coating containing a cinnamate polymer. However, the coating was free from a silane compound either in the photoresist coating or in an intermediate layer and the photoresist coating was also free from pigments and dyes.

The photosensitive printing plates of examples 5 through 8 are representative of the various embodiments of the invention. Thus, the plate of example 5 had a photosensitive resist coating containing a cinnamate polymer and also had an intermediate layer or undercoat of a silane compound, but the photoresist coating was free from pigments or dyes.

The plate of example 6 had a cinnamate polymer photoresist coating having a silane compound therein, but the photoresist coating was free from pigments or dyes.

In example 7 a cinnamate polymer photoresist coating containing pigments or dyes and had a silane compound intermediate layer or undercoat.

The remaining example 8 was a plate having a cinnamate polymer photoresist layer which contained in the photoresist a silane compound plus a dye.

The plates were light exposed through a standard test object which has been calibrated for dot size and were then hand developed and hand etched.

The comparative plate of example 4 has massive image loss. The reproduction was considered immeasurable or nonexistent. The vestige of an image was barely discernible. Therefore, this comparative plate had poor reproduction.

In the plate of example 5 the 40 micron diameter highlight dots (4%) on the film reproduced on the plate, and the 50 micron diameter shadow dots (93%) on the film reproduced as 35 micron dots on the plate. However, the 25 micron highlight dots (2%) were lost and the 20 micron shadow dots were not open. Therefore, this plate had good reproduction.

In the developed and etched plate of example 6,the 40 micron diameter highlight dot (4%) on the film reproduced on the plate and the 100 micron diameter shadow dots (30%) on the film reproduced as 75 micron diameter dots on the plate. However, the 25 micron highlight dots were lost, and the 50 micron and 25 shadow dots were not open. Therefore, this plate had fair to good reproduction.

In the plate example 7 the 25 micron diameter highlight dots (2%) on the film reproduced on the plate and the 20 micron diameter shadow dots (98%) on the film reproduced as 20 micron shadow dots on the plate. Everything on the film reproduced on the plate. Hence, this plate had excellent reproduction.

In the plate of example 8 the 40 micron diameter highlight dots (4%) on the film reproduced on the plate and the50 micron diameter shadow dots (93%) on the film reproduced at 50 micron shadow dots on the plate. However, the 25 micron highlight dots were lost and the 25 micron shadow dots were not open. Accordingly, this plate had good to excellent reproduction.

Considering the above discussion and comparative data, it will be apparent that the invention provides for the first time a means for utilizing satisfactorily photosensitive printing plates having a metallic base layer or substrate and a photosensitive resist coating thereover containing therein a cinnamate polymer or an aryl azide as the photosensitive material. Thus the plates of the invention, because of the association of a silane compound with the photoresist, have sufficiently strong physical properties of the photoresist coating so that it will withstand mechanical action during development. Moreover, the use of pigments or dyes in the photoresist coating greatly increases contrast after development and improves the reproduction characteristics.

The most remarkable embodiment of the invention, as shown by example 4 above, is that wherein the photoresist coating contains a pigment or a dye and has a silane compound as an undercoat or intermediate layer. The ability to retain small highlight dots while at the same time having the small shadow dots open is indeed highly desirable.

It will be appreciated that various modifications and changes may be made in the photosensitive printing plates of the invention, in addition to those set forth above, by those skilled in the art without departing from the essence of the invention and that therefore the invention is to be limited only within the scope of the appended claims.

What is claimed is:

1. In a photosensitive printing plate having a metallic base layer and a photosensitive resist coating thereover containing an organic solvent-soluble photosensitive material selected from the group consisting of cinnamate polymers and aryl azides, the improvement which comprises the association with the resist coating of a silane compound having the structural formula $$X-\overset{\displaystyle OR}{\underset{\displaystyle OR}{\overset{|}{\underset{|}{Si}}}}-OR$$

where R is an alkyl radical having from one to nine carbon atoms and X is an aminoalkyl radical having from one to 18 carbon atoms said silane compound being present in the photosensitive resist coating or in an intermediate layer between the metallic base layer and the photosensitive resist coating.

2. The photosensitive printing plate as defined by claim 1 wherein the silane compound is present in the photosensitive resist coating in an amount from about 2.4% to about 45% by weight thereof.

3. The photosensitive printing plate as defined by claim 2 wherein the amount of silane compound is about 31% by weight thereof.

4. The photosensitive printing plate as defined by claim 1 wherein the silane compound is present as an intermediate layer between the metallic base layer and the photosensitive resist coating.

5. The photosensitive printing plate as defined by claim 2 wherein the photosensitive resist coating also contains from about 0.2% to about 2% by weight of a dye selected from the group consisting of triarylmethane dyes, xanthene and copper pthalocyanine dyes.

6. The photosensitive printing plate as defined by claim 5 wherein the amount of dye is about 1.2% by weight.

7. The photosensitive printing plate as defined by claim 4 wherein the photosensitive resist coating contains from about 0.2% to about 2% by weight of a dye selected from the group consisting of triarylmethane dyes, xanthene dyes and copper phthalocyanine dyes.

8. The photosensitive printing plate as defined by claim 7 wherein the amount of dye is about 1.2% by weight.

9. The photosensitive printing plate as defined by claim 4 wherein the photosensitive resist coating also contains from about 3% to about 20% by weight of a pigment selected from the group consisting of phosphotungstomolybdic lakes of triarylmethane dyes and copper phthalocyanine pigments.

10. The photosensitive printing plate as defined by claim 9 wherein the amount of pigment is about 12% by weight.

11. The photosensitive printing plate as defined by claim 1 wherein the silane compound is N-beta-aminoethyl-gamma-aminopropyl trimethoxy silane.

PO-1050
(5/69)

UNITED STATES PATENT OFFICE
CERTIFICATE OF CORRECTION

Patent No. 3,615,538 Dated Oct. 26, 1971

Inventor(s) John E. Peters and Donald B. Johnson

It is certified that error appears in the above-identified patent and that said Letters Patent are hereby corrected as shown below:

Col. 3, line 5, after "methyl" delete the comma; line 56, before "5%" delete "X". Col. 4, line 11, after "$CH_3)_3$", "N-beta ..." should start a new line; line 13, "$(CH)_2)_3$" should read --$(CH_2)_3$--; line 16, after "$NH(CH_2)_3$" insert --$NH(CH_2)_3$--; line 22, "ClH" should read --Cl--; line 30, "(2-methoxyethoxy silane" should read --(2-methoxyethoxy) silane--. Col. 6, lines 44 and 45, after "resist" delete "composition in the light exposed areas serving as a resist"; line 70, "xyleneCellosolve" should read --xylene-Cellosolve--. Col. 7, line 3, "Example 2" should appear on a separate line as --EXAMPLE 2--; line 45, after "7" insert --the plates had--; line 52, "has" should read --had--; line 55, "has" should read --had--; line 72, after "plate" insert --of--. Col. 8, line 25, "example 4" should read --example 7--; line 69, after "xanthene" insert --dyes--; line 70, "pthalocyanine" should read --phthalocyanine--.

Signed and sealed this 2nd day of May 1972.

(SEAL)
Attest:

EDWARD M.FLETCHER,JR.
Attesting Officer

ROBERT GOTTSCHALK
Commissioner of Patents